United States Patent [19]

Nakamura et al.

[11] 4,055,755
[45] Oct. 25, 1977

[54] SWITCHING ASSEMBLY IN COMBINATION WRISTWATCH AND CALCULATOR

[75] Inventors: Tutomu Nakamura, Akashi; Takehiko Sasaki, Yamatokoriyama; Masaji Yonekawa, Sakurai; Hidetoshi Maeda, Tenri, all of Japan

[73] Assignee: Sharp Kabushiki Kaisha, Osaka, Japan

[21] Appl. No.: 677,441

[22] Filed: Apr. 15, 1976

[30] Foreign Application Priority Data

Apr. 16, 1975 Japan .............................. 50-52299[U]
Apr. 18, 1975 Japan .............................. 50-53886[U]

[51] Int. Cl.² .................... G06F 15/02; G06F 7/38; G04B 47/00; H01H 35/00
[52] U.S. Cl. .................................. 364/705; 58/50 R; 58/152 R; 307/116; 340/365 C; 364/709
[58] Field of Search ............... 235/152, 156; 58/50 R, 58/152 R; 200/5 A; 307/116, 125, 130; 340/365 C

[56] References Cited

U.S. PATENT DOCUMENTS

| 3,737,670 | 6/1973 | Larson ................................. 307/116 |
| 3,766,404 | 10/1973 | Larson et al. ...................... 307/116 |
| 3,803,834 | 4/1974 | Reese ................................. 58/152 R |
| 3,877,029 | 4/1975 | Larson et al. .................... 340/365 C |
| 3,928,960 | 12/1975 | Reese ................................. 235/156 X |
| 3,958,239 | 5/1976 | Green ........................... 340/365 C X |
| 3,973,255 | 8/1976 | Freeman ...................... 340/365 C X |

FOREIGN PATENT DOCUMENTS 1,391,637 4/1975 United Kingdom .............. 58/152 R Primary Examiner—Jerry Smith
Attorney, Agent, or Firm—Birch, Stewart, Kolasch & Birch

[57] ABSTRACT

In a combination wristwatch and calculator, a key input means for information entry employs a touch sensitive electronic switching circuitry comprising a C-MOS inverter. One electrode for the touch sensitive electronic switching circuitry is provided on the front panel of the combination wristwatch and calculator, whereas another electrode for the touch sensitive electronic switching circuitry is positioned on the rear surface of the combination wristwatch and calculator. The present key input means is equally applicable to a miniature electronic calculator.

2 Claims, 5 Drawing Figures

FIG. 1
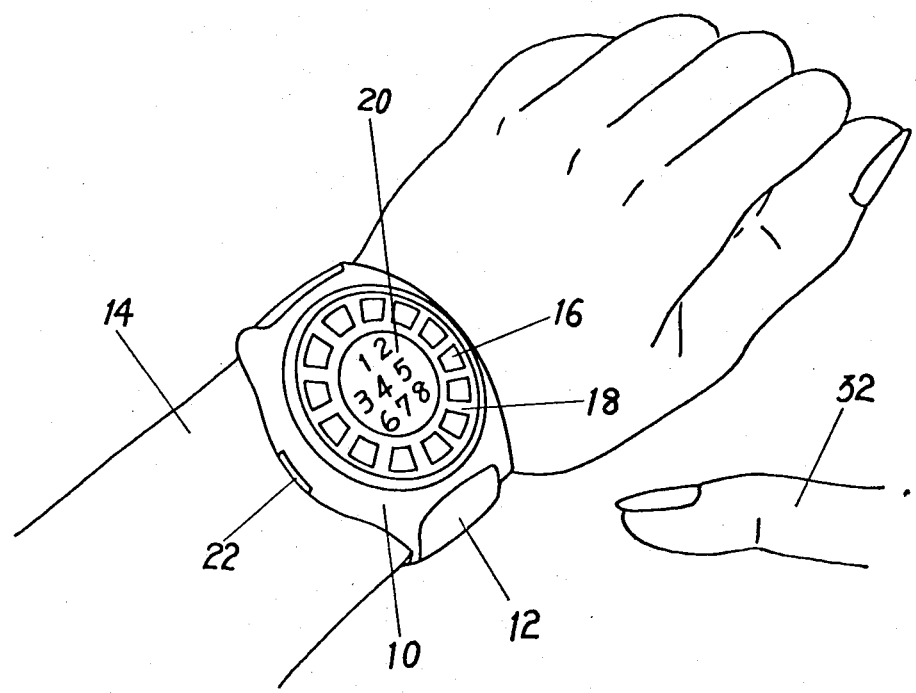
FIG. 3
FIG. 2
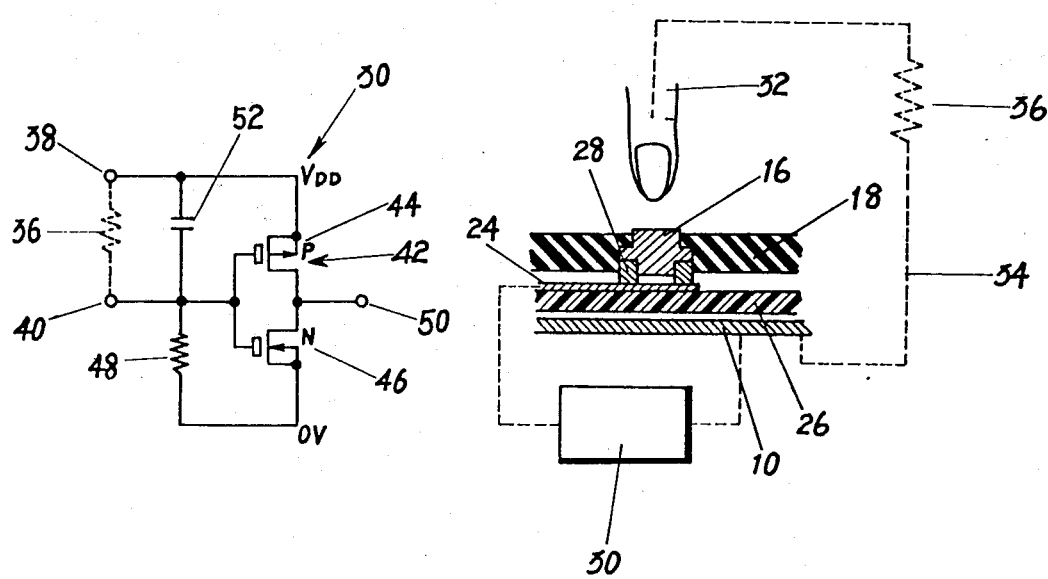

SWITCHING ASSEMBLY IN COMBINATION WRISTWATCH AND CALCULATOR

BACKGROUND OF THE INVENTION

The present invention relates to a key input means for information entry in a miniature electronic calculator or in a combination wristwatch and calculator.

In a conventional miniature electronic calculator, a key input means usually comprises push-button switches which develop key input signals upon manual depression. The push-button switch requires a considerably long stroke to ensure stable operation. This renders the miniature electronic calculator thick and, therefore, the push-button switches are not suited for fabricating a thin miniature electronic calculator and, especially, not suited for a combination wristwatch and calculator.

Moreover, a keyboard unit comprising a plurality of push-button switches requires a considerably large space to ensure accurate introduction of desired information. This precludes realization of a combination wristwatch and calculator of a compact size.

OBJECTS AND SUMMARY OF THE INVENTION

Accordingly, an object of the present invention is to provide an improved combination wristwatch and calculator.

Another object of the present invention is to provide a combination wristwatch and calculator of a compact size.

Still another object of the present invention is to provide a thin miniature electronic calculator or a thin combination wristwatch and calculator.

Yet another object of the present invention is to provide an improved key input means for information entry in a miniature electronic calculator or in a combination wristwatch and calculator.

A further object of the present invention is to provide an improved key input means of little power dissipation for use in a miniature electronic calculator or in a combination wristwatch and calculator.

A still further object of the present invention is to provide an improved key input means suited for accurate information entry in a miniature electronic calculator or in a combination wristwatch and calculator.

Other objects and further scope of applicability of the present invention will become apparent from the detailed description given hereinafter. It should be understood, however, that the detailed description and specific examples, while indicating preferred embodiments of the invention, are given by way of illustration only, since various changes and modifications within the spirit and scope of the invention will become apparent to those skilled in the art from this detailed description.

To achieve the above objectives, pursuant to an embodiment of the present invention, a key input means for information entry employs a plurality of touch sensitive electronic switching circuitries each of which comprises a C-MOS inverter. First electrodes for each of the plural touch sensitive electronic switching circuitries are independently or separately formed on a front panel of a miniature electronic calculator or on a front panel of a combination wristwatch and calculator. Whereas second electrodes of the touch sensitive electronic switching circuitries are formed, in common, on a rear surface of the miniature electronic calculator or on a rear surface of the combination wristwatch and calculator.

BRIEF DESCRIPTION OF THE DRAWINGS

The present invention will become more fully understood from the detailed description given hereinbelow and the accompanying drawings which are given by way of illustration only, and thus are not limitative of the present invention and wherein, FIG. 1 is a perspective view of a combination wristwatch and calculator employing a key input means of the present invention;

FIG. 2 is a sectional view of an embodiment of the key input means of the present invention;

FIG. 3 is a circuit diagram of a touch sensitive electronic switching circuitry associated with the key input means of the present invention;

DESCRIPTION OF THE PREFERRED EMBODIMENTS

Figure 4:
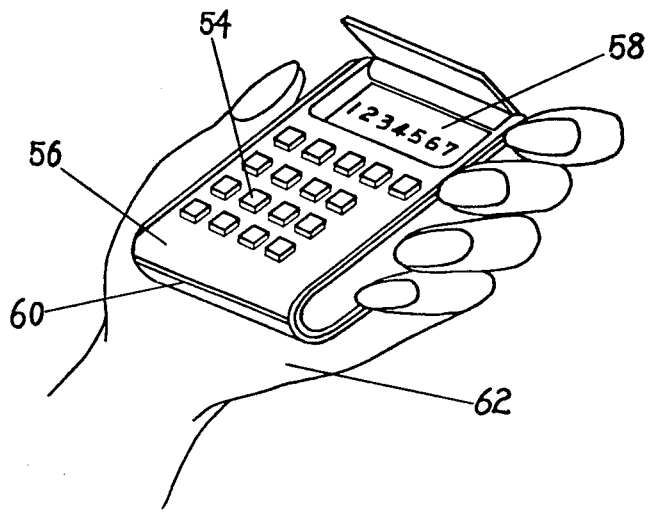
FIG. 4 is a perspective view of a miniature electronic calculator employing the key input means of the present invention.

Referring now to FIG. 1, there is illustrated a combination wristwatch and calculator employing a key input means of the present invention, a metal frame 10 of the combination wristwatch and calculator or a metal band 12 attached to the combination wristwatch and calculator contacts a wrist 14 of the operator who wears the combination wristwatch and calculator. The metal frame 10 or the metal band 12 functions as one electrode of the touch sensitive electronic switching circuitries, details of which will be described later with reference to FIG. 3. A plurality of touch electrodes 16 of a desired number, such as numeral keys, are formed on an insulating frame 18 supporting a display 20 in order to introduce desired information into the combination wristwatch and calculator. Each of the touch electrodes 16 functions as another electrode of the respective touch sensitive electronic switching circuitries.

A mode switch 22 is provided at the side wall of the metal frame 10 for mutually selecting the time display and the calculate operations. A typical construction of the combination wristwatch and calculator, and the operation mode of the mode switch are shown in U.S. Pat. No. 3,928,960, Robert O. Reese, COMBINATION WRISTWATCH AND CALCULATOR. Therefore, details of the combination wristwatch and calculator have been omitted from this detailed description for the purpose of simplicity.

FIG. 2 shows an example of the touch electrode construction. The touch electrode 16 is electrically connected to an electrode pattern 24 formed on a circuit board 26 through conductive connectors 28. The circuit board 26 carries necessary electronic elements such as a computation circuit, a time keeping circuit and a decoder/driver circuit for information display thereon. The circuit board 26 further carries touch sensitive electronic switching circuitries 30, each of which have two input terminals, one being connected to the electrode pattern 24 and the other being connected to the metal frame 10. When the operator touches the touch electrode 16 with his finger 32 of the hand opposite to that wearing the combination wristwatch and calculator, an electric circuitry 34 mainly comprising a resistor 36 of the operator's body is connected between the two input terminals of the touch sensitive electronic switching circuitry 30. The computation circuit, the time keeping circuit, the decoder/driver circuit and the touch sensitive electronic switching circuitries 30 can be incorporated in a single integrated circuit chip.

The touch sensitive electronic switching circuitries 30 are provided in a desired number to correspond to the respective touch electrodes 16 formed on the insulating frame 18. The metal frame 10 functions as one electrodes of the respective touch sensitive electronic switching circuitries 30, in common. With such an arrangement, the respective touch sensitive electronic switching circuitries 30 develop different input signals corresponding to the respective touch electrodes 16.

FIG. 3 shows a typical construction of the touch sensitive electronic switching circuitry 30. One input terminal 38 is connected to the metal frame 10, or the common electrode, whereas another input terminal 40 is connected to one of the touch electrodes 16, or the numeral keys, through the electrode pattern 24. The touch sensitive electronic switching circuitry 30 mainly comprises a C-MOS inverter 42 including a P-channel MOS transistor 44 and an N-channel MOS transistor 46.

Usually, an input level of the C-MOS inverter 42 is maintained at a low level (logic value "0") via a resistor 48 and, hence, an output signal from an output terminal 50 takes a high level (logic value "1"). When the operator touches the touch electrode 16, the resistor 36 of the operator's body is connected between the two input terminals 38 and 40, whereby the input level of the C-MOS inverter 42 becomes a voltage level determined by a potential divided by the resistor 36 of the operator's body and the resistor 48. This makes the C-MOS inverter 42 invert its condition, and results in that the output signal from the output terminal 50 changes to a low level (logic value "0"). This inversion of the output signal level can be used as a key input signal. In the touch sensitive electronic switching circuitry 30, a capacitor 52 functions to prevent the introduction of an induced noise into the circuitry.

More detailed constructions and the operation mode of the touch sensitive electronic switching circuitry comprising a C-MOS inverter or a C-MOS exclusive OR, and applicable to this invention are shown and described in U.S. patent application Ser. No. 575,731, SWITCHING MECHANISM FOR ELECTRONIC WRISTWATCH, filed May 8, 1975, assigned to the same assignee as the present invention, which is incorporated by reference herein.

Referring now to FIG. 4, there is illustrated a miniature electronic calculator employing numeral keys and function keys made of touch electrodes of the present invention, a plurality of touch electrodes 54 are formed on an insulating front panel 56 in order to introduce desired information into the miniature electronic calculator. An information diaplay 58 is secured at a preferred position of the miniature electronic calculator, and a metal rear frame 60 of the miniature electronic calculator is kept in contact with an operator's hand 62 when the miniature electronic calculator is held by the operator to perform the arithmetic calculation.

The key input operation can be achieved in a same manner as discussed with reference to FIGS. 2 and 3. The touch electrodes 54 correspond to the touch electrodes 16 of FIG. 2, whereas the metal rear frame 60 corresponds to the metal frame 10 of FIG. 2.

Figure 5:
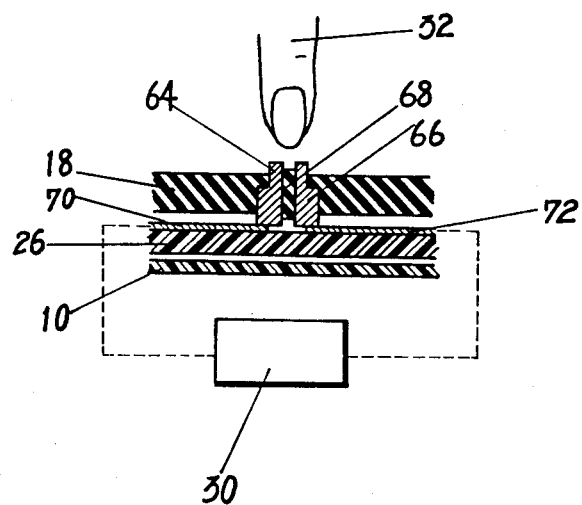
FIG. 5 is a sectional view of another embodiment of the key input means of the present invention.

FIG. 5 shows another example of the touch electrode construction. Like elements corresponding to those of FIG. 2 are indicated by like numerals. A pair of touch electrodes 64 and 66 are formed on the insulating frame 18 with intervention of an insulating chip 68. The pair of touch electrodes 64 and 66 are electrically connected to electrode patterns 70 and 72 formed on the circuit board 26, respectively. The respective electrode patterns 70 and 72 are connected to the input terminals 38 and 40 of the touch sensitive electronic swithcing cirucitry 30 shown in FIG. 3.

When the pair of touch electrodes 64 and 66 are connected with each other through the operator's finger 32, the C-MOS inverter 42 inverts its state and, then, develops a key input signal as already discussed above. In the embodiment of FIG. 5, the metal frame 10 is not required to contact the operator's body and, therefore, the frame 10 can be made of insulating material, and the apparatus can be used in a condition where it is put on a desk. Accordingly, the touch electrode construction of FIG. 5 is suited for a miniature electronic calculator.

The invention being thus described, it will be obvious that the same may be varied in many ways. Such variations are not to be regarded as a departure from the spirit and scope of the invention, and all such modifications are intended to be included within the scope of the following claims.

What is claimed is:

1. A combination wristwatch and calculator including a conductive casing, a front insulating panel, a time keeping circuit, an arithmetic calculation circuit, a key input means for introducing desired information into the arithmetic calculation circuit, and an information display for displaying information stored in the time keeping circuit and the arithmetic calculation circuit, said key input means comprising:

a plurality of touch electrodes formed on the front insulating panel; and
   a plurality of touch sensitive electronic switching circuits, each of the touch sensitive electronic switching circuits including;
   a C-MOS inverter circuit having a gate terminal and two power supply terminals,
   a power source connected across said power supply terminals,
   two input terminals connected to one of said touch electrodes and to said conductive casing, respectively, and
   circuit means for inverting the condition of said C-MOS inverter circuit when said two input terminal are connected to each other through a human body resistor.

2. The combination wristwatch and calculator of claim 1, which further comprises a metal belt attached to the combination wristwatch and calculator, wherein the touch sensitive electronic switching circuitries are commonly connected to the metal belt.

* * * * *